(12) United States Patent
Thakur

(10) Patent No.: US 8,723,027 B2
(45) Date of Patent: May 13, 2014

(54) PHOTOVOLTAIC APPLICATIONS OF NON-CONJUGATED CONDUCTIVE POLYMERS

(76) Inventor: Mrinal Thakur, Auburn, AL (US)

( * ) Notice: Subject to any disclaimer, the term of this patent is extended or adjusted under 35 U.S.C. 154(b) by 0 days.

(21) Appl. No.: 13/432,095

(22) Filed: Mar. 28, 2012

(65) Prior Publication Data

US 2013/0153862 A1 Jun. 20, 2013

Related U.S. Application Data

(63) Continuation-in-part of application No. 12/031,053, filed on Feb. 14, 2008, now abandoned.

(51) Int. Cl.
*H01L 31/00* (2006.01)
*H01L 21/00* (2006.01)

(52) U.S. Cl.
USPC ............................................. 136/263; 438/82

(58) Field of Classification Search
CPC ... H01L 25/045; H01L 25/047; H01L 51/424; H01L 51/4253; H01L 51/441; H01L 51/442
USPC ............................................. 136/263; 438/82
See application file for complete search history.

(56) References Cited

U.S. PATENT DOCUMENTS

| | | | | |
|---|---|---|---|---|
| 4,514,584 | A * | 4/1985 | Fox et al. ...................... | 136/263 |
| 4,765,928 | A | 8/1988 | Thakur | |
| 6,300,612 | B1 * | 10/2001 | Yu .............................. | 250/208.1 |
| 7,170,086 | B2 | 1/2007 | Suh et al. | |
| 7,311,997 | B2 | 12/2007 | Thakur | |
| 7,351,359 | B2 | 4/2008 | Maruyama et al. | |
| 2002/0017612 | A1 | 2/2002 | Yu et al. | |
| 2005/0048314 | A1 | 3/2005 | Antoniadis et al. | |
| 2005/0163918 | A1 * | 7/2005 | Thakur .......................... | 427/66 |
| 2005/0263180 | A1 * | 12/2005 | Montello et al. .............. | 136/244 |

FOREIGN PATENT DOCUMENTS

| | | | |
|---|---|---|---|
| EP | 1020881 | | 7/2000 |
| IN | 200300710 I4 | * | 7/2005 |
| IN | 200300791 I4 | * | 7/2005 |

OTHER PUBLICATIONS

Titus et al. "Two Photon Absorption in a Novel Nano-Optical Material based on the Nonconjugated Conductive Polymer, Poly (beta-pinene)". Abstract submitted for the Mar. 2006 meeting of The American Physical Society.

Vippa et al., "Electrical and Optical Properties of a Novel Nonconjugated Conductive Polymer, poly(B-pinene)", Journal of Polymer Science: Part B: Polymer Physics, vol. 43, 3695-3698 (2005).

Fullerene, article from Wikipedia.org, http://en.wikipedia.org/wiki/Fullerene.

Polyallocimene and method for the preparation thereof, article from www.freepatentsonline.com.

Polyalloocimene, a novel nonconjugated conductive polymer: The correct fundamental basis for conductive polymers, Thakur, M. from http://cat.inist.fr.

Polyallocimene, II, C.S. Marvel, P.E. Kiener, article from Journal of Polymer Science, vol. 61, Issue 172, pp. 311-331; Mar. 10, 2003, from http://www3.interscience.wiley.com.

Air-Gaps Via Thermally Decomposable Polymers and Their Application to Complaint Wafer Level Packaging (CWLP), Hollie Anne Kelleher, Dec. 6, 2004, from Thesis & Dissertation collection, http://etd.gatech.edu/theses/available/etd.

Multi-layer polynorbornene and epoxy laminates and process for making teh same, from http://freepatentsonline.com.

Thermal decomposition kinetics of functionalized polynorbornene, Michael D. Wedlake, Paul A. Kohl, from http://www.mrs.org/s)_mrs/sec_subscribe.asp?CID=2259&DID=81.

Investigation of poly(arylenevinylene)s, 40a; Manfred Helbig, Hans-Heinrich Horhold; Friedrich-Schiller-Universitat Jena, Institu fur Organische Chemie und Makromolekulare Chemie, Humboldstr. 10, 0-6900 Jena, Germany; (Received: Oct. 5, 1992) pp. 1607-1618.

Lightweight Rechargeable Storage Batteries Using Polyacetylene, (CH) as the Cathode-Active Material; Paul J. Nigrey, DAvid MacInnes, Jr., David P. Narns, and Alan G. MacDiarmid; Department of Chemistry, University of Pennsylvania, Philadelphia, Pennsylvania 19104; and Alan J. Heeger Department f Physics, University of Pennsylvania 19104; pp. 1651-1654.

A new polymer/polymer rechargeable battery: polyanilline/LiClO4(MeCN)/poly-1-naphthol; H.H. Rehan; Chemistry Department, College of Education for girls, Malaz, Riyadh 11417, P.O. Box 27104, Saudi Arabia; Received May 27, 2002; received in revised form Sep. 4, 2002; accepted Sep. 8, 2002; pp. 57-61.

Electrical conductivity in the Nonconjugated Polymer Styrene-Butadiene-Rubber (SBR).

Norbornene, from Wikipedia, http://en.wikipedia.org/wiki/Norbornene.

Article from http://dot.che.gatech.edu/henderson/Research%20Interests/polymer, Clifford L. Henderson.

Material Safety Data Sheet.

TCI America catalog page for poly(N-vinylcarbazole); http://www.tciamerica.com/catalog/P0656.html. Retrieved on Mar. 16, 2011.

Pina et al. ("On the triplet state of poly (N-vinylcarbazole)"); Chemiocal Physics Letters 400 (2004) 441-445.

(Continued)

*Primary Examiner* — Eli Mekhlin

(57) ABSTRACT

A photovoltaic structure having an electrode of a glass substrate coated with a high work function metal to which a film of a combination of a non-conjugated conductive polymer and an electron acceptor such as fullerene, carbon, iodine, or potassium iodide is applied. The structure has a second electrode of a low work function metal that has been coated on the glass substrate. This glass substrate with the low work function metal is applied to the film. Among the non-conjugated polymers are polyisoprene, poly(β-pinene), cis-polyisoprene, styrene-butadiene-rubber copolymer, polynobornene and polyalloocimene. When light strikes this photovoltaic structure it is capable of generating electric voltage greater than 100 mV for a light intensity of about 5 mW/cm².

21 Claims, No Drawings

(56) References Cited

OTHER PUBLICATIONS

Padinger et al. ("CW-Photocurrent measurements of conjugated polymers and fullerenes blended into a conventional polymer matrix"); Synthetic Metasl 102 (1999) 1285-1286.

Tu et al. ("Violet electroluminescence from poly(N-vinylcarbazole)ZnO-nanrod composite polymer light-emitting devices"); Synthetic Metals 161 (2011) 450-454.

Essential Bonding Theory for UV-Visible Absorption Spectrometry; http://www.chemguiude.co.uk/analysis/uvvisible/bonding.html, pp. 1-16.

* cited by examiner

PHOTOVOLTAIC APPLICATIONS OF NON-CONJUGATED CONDUCTIVE POLYMERS

CROSS-REFERENCE RELATED APPLICATION

This application is a Continuation-In-Part of U.S. application Ser. No. 12/031,053 filed Feb. 14, 2008, incorporated by reference now abandoned.

TECHNICAL FIELD

The present invention is generally related to photovoltaic structures in which a film of a non-conjugated conductive polymer and an electron acceptor is sandwiched between a high work function metal and a low work function metal.

BACKGROUND

Photovoltaic effect involves generation of a potential difference or voltage in a material structure through interaction with photons or light. There are two major areas of applications of the photovoltaic effect. These include: i) detectors of light or photons and ii) electrical power generation. A wide range of inorganic semiconductors are used for photodetector applications at various wavelengths through photovoltaic effect. The solar cell is an example of the application of the photovoltaic effect for power generation. In either of the applications a junction structure (diode) is constructed using the material considered and appropriate interfaces. As photons or a light beam is made incident on this structure, electrons and holes are generated provided the wavelength of the light is sufficiently small (photon energy more than the band gap) and these charges are then swept across the junction due to the built-in electric field at the junction. When these charges reach the opposite electrodes a voltage is produced as the output. This is the basic mechanism of the photovoltaic effect.

As stated earlier, inorganic semiconductors are widely used in photovoltaic applications. Most commercial solar cells are made of silicon. However, these materials are expensive, inflexible, heavy and cannot be made as a large-area solar panel. Recently specific organic/polymeric materials and the combinations of organic/polymeric materials have been shown to exhibit substantial photovoltaic effects. A wide range of applications of these novel materials in light detectors and solar cells have been predicted. In particular, conjugated conductive polymers have been shown to have photovoltaic effect when combined with specific types of electron acceptors such as fullerene ($C_{60}$). A conjugated polymer is a polymer with alternating double and single bonds between carbon atoms. When a conjugated polymer/$C_{60}$ composite is irradiated with light an electron is transferred from the polymer to the $C_{60}$ molecule. If the composite is placed between two metals of dissimilar (high and a low) work functions, the extra electron in the $C_{60}$ molecule is transported to the metal of the low work function (e.g. aluminum) and the hole created in the conjugated polymer is transported to the metal of high work function (e.g. indium-tin-oxide). Thus a voltage is created between the two metal contacts. Such photovoltaic effect involving conjugated polymers have been widely demonstrated.

DETAILED DESCRIPTION OF THE PREFERRED EMBODIMENTS

It has been discovered that non-conjugated polymers have a photovoltaic effect when subjected to light. Non-conjugated polymers include all of those conductive polymers that have a ratio of double bond to total bonds, that is a lower fraction than ½. It includes polymers where there is only one double bond in each repeat. It does not include polymers that are ionic or redox couples. It will be recognized that there can be one or more double bonds in the repeat if the ratio of double bonds and total bonds is lower than "½."

Examples of non-conjugated polymers include: polyisoprene (natural rubber), poly(β-pinene), cis-polyisoprene, a styrene-butadiene-rubber copolymer (SBR), polynobornene and polyalloocimene. Since these polymers have isolated double-bonds, electrons are not delocalized as in a conjugated polymer. The band gaps of the non-conjugated conductive polymers are large. Due to the large band-gaps and the lack of delocalized electrons any photovoltaic effect in non-conjugated conductive polymers was not expected. However, significant photovoltaic effects have been discovered in non-conjugated conductive polymers. Such photovoltaic effect have a wide range of applications in light detection and power generation. Since nonconjugated conductive polymers are easily processable as large-area films and are very inexpensive, these non-conjugated polymers are highly promising for large-volume applications involving the photovoltaic effect.

The overall structure of a photovoltaic device based on a non-conjugated conductive polymer includes a high work function metal, such as an indium-tin-oxide transparent substrate, as one electrode. The transparent substrate can be glass, quartz or plastic. Glass is preferred. A conductive non-conjugated polymer in combination with an electron acceptor, such as fullerene (composite), carbon, iodine or potassium iodide is cast as a thin film on indium-tin-oxide coated glass substrate. Fullerene ($C_{60}$) is preferred. Other electron acceptors, such as functionalized fullerenes, carbon, iodine and KI (potassium iodide) may be used. Preferably from 2 to 15% of fullerene by weight based upon the weight of the non-conjugated polymer can be used. Within that range from 4 to 10% of fullerene based on the weight of the non-conjugated polymer is preferred. Then a low work function metal, such as aluminum, calcium or magnesium, is used; preferably aluminum is used. The low work function metal, such as aluminum, to serve as an electrode can be applied on the polymer film. The low work function metal can be coated on a transparent substrate, such as glass, quartz or plastic, which can be applied to the film. Glass is preferred.

This interface structure is illuminated with light incident through the transparent tin-oxide substrate and the generated voltage is measured with a multimeter. In addition, the diode characteristic of the structure has been studied with and without the incident light.

The amount of photo voltage (open-circuit voltage generated) can be in excess of 100 mV for a light intensity of about 5 mW/cm². The photo voltage structure of this invention can be used for photo detectors and for solar set. Two or more photovoltaic devices can be connected serially in an array to increase the amount of voltage produced by the photovoltaic structure.

Instead of $C_{60}$, carbon, iodine or KI (potassium iodide) can be used as the electron acceptor. The indium-tin-oxide (ITO) coated glass has an additional coating made of $TiO_2$ which acts as the low work-function electrode. Carbon (C) coated on an ITO glass substrate acts as the high work-function electrode. This type of cell structure has been discussed in the literature although the active materials have all been conjugated molecules and polymers. In this invention, case, non-conjugated conductive polymers are used as active materials. Higher electric currents and voltages when light is incident are produced in these cells.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

Example 1

A sample of cis-polyisoprene (natural rubber) was weighed and dissolved in toluene. Then a fullerene ($C_{60}$) sample purchased from Sigma-Aldrich Chemical Corp. was weighed and dissolved in a cis-polyisoprene-toluene solution. In the solution, the weight of fullerene was about 5% of that of polyisoprene. A thin film of a thickness of about 1 micron was cast from this final solution onto an indium-tin-oxide (ITO) coated glass substrate. This film was a composite of cis-polyisoprene and $C_{60}$. Then an aluminum coated glass substrate was placed on the film to make a junction structure of ITO/polyisoprene-$C_{60}$/aluminum. The ITO is a high work function metal while aluminum is a low work function metal. Therefore this junction has the characteristic of a diode. The output voltage between the ITO and aluminum was measured in the dark and with light (from a light bulb) incident on the junction through the transparent ITO electrode. When the light was on a significant change in the output voltage was observed (photovoltaic effect). A photovoltage (open-circuit voltage) of approximately 200 mV was observed due to a light intensity of about 5 mW/cm$^2$.

The current-voltage characteristics of the ITO/polyisoprene-$C_{60}$/aluminum structure was measured in the dark and with light-on conditions. Significant changes in the current (photocurrent) was detected when the light was incident compared to dark condition.

Example 2

A sample of poly($\beta$-pinene) was weighed and dissolved in toluene. Then a fullerene ($C_{60}$) sample purchased from Sigma-Aldrich Chemical Corp. was weighed and dissolved in the poly($\beta$-pinene)-toluene solution. In the solution the weight of fullerene was about 4% of that of that poly($\beta$-pinene). A thin film of about 500 nm was cast from this final solution on an indium-tin-oxide (ITO) coated glass substrate. This film involved a composite of poly($\beta$-pinene) and fullerene $C_{60}$. The film was heat-treated at about 50° C. for a few hours. Thus a uniform film was obtained. Then an aluminum coated glass substrate was placed on the film to make a junction structure comprised of ITO/poly($\beta$-pinene)-$C_{60}$/aluminum. The ITO is a high work function metal while aluminum is a low work function metal. Therefore this junction had the characteristic of a diode. The output voltage between the ITO and aluminum was measured in the dark and with light (from a light bulb) incident on the junction through the transparent ITO electrode. When the light was on a significant change in the output voltage was observed. The current-voltage characteristics of the ITO/poly($\beta$-pinene)-$C_{60}$/aluminum structure was measured in the dark and with light-on conditions. The change in voltage (photovoltaic, open-circuit voltage) as a function of incident intensity has been recorded. Significant changes in the current (photocurrent) was detected when the light was incident compared to dark condition. A photovoltage (open-circuit voltage) of about 200 mV was observed for a light intensity of about 5 mW/cm$^2$.

Example 3

A sample of poly($\beta$-pinene) was weighed and dissolved in toluene. Then a fullerene ($C_{60}$) sample purchased from Sigma-Aldrich Chemical Corp. was weighed and dissolved in the poly($\beta$-pinene)-toluene solution. In the solution, the weight of the fullerene was about 10% that of poly($\beta$-pinene). A thin film of about 500 nm was cast from this final solution on an indium-tin-oxide (ITO) coated glass substrate. This film was a composite of poly($\beta$-pinene) and $C_{60}$. The film was heat-treated at about 50° C. for a few hours. Then an aluminum coated glass substrate was placed on the film to make a junction structure, ITO/poly($\beta$-pinene)-$C_{60}$/aluminum. The ITO is a high work function metal while aluminum is a low work function. Therefore this junction had the characteristic of a diode. The output voltage between the ITO and aluminum was measured in the dark and with light (from a light bulb) incident on the junction through the transparent ITO electrode. When the light was on a significant change in the output voltage was observed. The current-voltage characteristics of the ITO/poly($\beta$-pinene)-$C_{60}$/aluminum structure was measured in the dark and with light-on conditions. Significant changes in the current (photocurrent) was detected when the light was incident compared to dark condition. A photovoltage of about 250 mV was observed for a light intensity of about 5 mW/cm$^2$.

Example 4

A sample of polynobornene (purchased from Sigma-Aldrich Chemical Corp.) was weighed and dissolved in toluene. Then a fullerene ($C_{60}$) sample purchased from Sigma-Aldrich Chemical Corp. was weighed and dissolved in the polynobornene-toluene solution. In the solution the weight of the fullerene was about 5% of the polynobornene. A thin film of about 500 nm was cast from this final solution on an indium-tin-oxide (ITO) coated glass substrate. This film was a composite of polynobornene and $C_{60}$. Then an aluminum coated glass substrate was placed on the film to make a junction structure, ITO/polynobornene-$C_{60}$/aluminum. The ITO is a high work function metal while aluminum is a low work function metal. Therefore this junction had the characteristic of a diode. The output voltage between the ITO and aluminum was measured in the dark and with light (from a light bulb) incident on the junction through the transparent ITO electrode. When the light was on a significant change in the output voltage was observed. The current-voltage characteristics of the ITO/polynobornene-$C_{60}$/aluminum structure was measured in the dark and with light-on conditions. Significant changes in the current (photocurrent) was detected when the light was incident compared to dark condition. A photovoltage (open-circuit voltage) of about 150 mV was observed for a light intensity of about 5 mW/cm$^2$.

Example 5

A sample of poly($\beta$-pinene) was weighed and dissolved in toluene. Then fullerene ($C_{60}$) sample purchased from Sigma-Aldrich Chemical Corp. was weighed and dissolved in the poly($\beta$-pinene)-toluene solution. In the solution the weight of fullerene was about 4% of that of poly($\beta$-pinene). A thin film of about 500 nm was cast from this final solution on an indium-tin-oxide (ITO) coated glass substrate. This film involved a composite of poly($\beta$-pinene) and $C_{60}$. The film was heat-treated at about 50° C. for a few hours. Thus a uniform film was obtained. Then an aluminum coated glass substrate was placed on the film to make a junction structure comprised of ITO/poly($\beta$-pinene)-$C_{60}$/aluminum. The ITO is a high work function metal while aluminum is a low work function metal. Therefore this junction had the characteristic of a diode. The output voltage between the ITO and aluminum was measured in the dark and with laser beam incident on the junction through the transparent ITO electrode. The laser beam was obtained using a nitrogen laser at 325 nm wavelength. When the laser was on a significant change in the output voltage was observed. A photovoltage (open-circuit voltage) of 100 mV was detected for a laser light intensity of about 5 mW/cm$^2$.

Example 6

A sample of poly($\beta$-pinene) was weighed and dissolved in toluene. Then fullerene ($C_{60}$) sample purchased from Sigma-Aldrich Chemical Corp. was weighed and dissolved in the poly($\beta$-pinene)-toluene solution. In the solution the weight of fullerene was about 4% of that of poly($\beta$-pinene). A thin film of about 500 nm was cast from this final solution on an indium-tin-oxide (ITO) coated glass substrate. This film involved a composite of poly($\beta$-pinene) and $C_{60}$. The film was heat-treated at about 50° C. for a few hours. Thus a uniform film was obtained. Then an aluminum coated glass substrate was placed on the film to make a junction structure comprised of ITO/poly($\beta$-pinene)-$C_{60}$/aluminum. The ITO is a high work function metal while aluminum is a low work function metal. Therefore this junction had the characteristic of a diode. The output voltage between the ITO and aluminum was measured in the dark and with light (from a light bulb) incident on the junction through the transparent ITO electrode. When the light was on a significant change in the output voltage was observed. The current-voltage characteristics of the ITO/poly($\beta$-pinene)-$C_{60}$/aluminum structure was measured in the dark and with light-on conditions. A photovoltage (open-circuit voltage) of about 200 mV was observed for a light intensity of about 5 mW/cm$^2$. Two such devices were connected in series and the experiment was repeated. A photovoltage (open-circuit voltage) of about 800 mV was observed for a light intensity of 10 mW/cm$^2$. This shows serial connectivity of the devices and proportional increase in the photovoltage.

Example 7

On a glass substrate with indium tin-oxide (ITO) coating (substrate 1), a thin layer of titanium dioxide (consisting of TiO$_2$ nanoparticles) was deposited following a procedure known in the literature. Another ITO glass substrate (substrate 2) with a coating of carbon (C) deposited from a flame was prepared. Then a thin film of a nonconjugated conductive polymer (NCP), 1,4-cis-polyisoprene, was deposited from solution (in toluene). The polymer film was doped with iodine. Then substrate 1 (with TiO$_2$) and substrate 2 were assembled as a sandwich with the doped polymer film between the two substrates. In a glass container, potassium iodide (KI) was dissolved in ethylene glycol. A few drops of that KI solution were introduced between the substrates (sandwich). Thus a photovoltaic cell (TiO$_2$/KI/NCP/C) was formed. Leads were connected to ITO/TiO$_2$ and ITO/carbon substrates. The voltages and the currents produced by this cell for different intensities of light incident on it through the ITO/TiO$_2$ substrate, were recorded using appropriate measurement devices (Keithley 617 and Keithley 2400). About 0.6 volts and a maximum current of 0.1 mA were produced for a light intensity of about 4 mW/cm$^2$.

Example 8

On a glass substrate with indium tin-oxide (ITO) coating (substrate 1), a thin layer of titanium dioxide (consisting of TiO$_2$ nanoparticles) was deposited following a procedure known in the literature. Another ITO glass substrate (substrate 2) with a coating of carbon (C) deposited from a flame was prepared. Then a thin film of a nonconjugated conductive polymer (NCP), poly($\beta$-pinene), was deposited from solution (in toluene). The polymer film was doped with iodine. Then substrate 1 (with TiO$_2$) and substrate 2 were assembled as a sandwich with the doped polymer film between the two substrates. In a glass container, potassium iodide (KI) was dissolved in ethylene glycol. A few drops of that KI solution were introduced between the substrates (sandwich). Thus a photovoltaic cell (TiO$_2$/KI/NCP/C) was formed. Leads were connected to ITO/TiO$_2$ and ITO/carbon substrates. The voltages and the currents produced by this cell for different intensities of light incident on it through the ITO/TiO$_2$ substrate, were recorded using appropriate measurement devices (Keithley 617 and Keithley 2400). About 0.7 volts and a maximum current of 0.1 mA were produced for a light intensity of about 4 mW/cm$^2$.

Example 9

On a glass substrate with indium tin-oxide (ITO) coating (substrate 1), a thin layer of titanium dioxide (consisting of TiO$_2$ nanoparticles) was deposited following a procedure known in the literature. Another ITO glass substrate (substrate 2) with a coating of carbon (C) deposited from a flame was prepared. Then a thin film of a nonconjugated conductive polymer (NCP), trans-polyisoprene, was deposited from solution (in toluene). The polymer film was doped with iodine. Then substrate 1 (TiO$_2$) and substrate 2 were assembled as a sandwich with the doped polymer film between the two substrates. In a glass container, potassium iodide (KI) was dissolved in ethylene glycol. A few drops of that KI solution were introduced between the substrates (sandwich). Thus a photovoltaic cell (TiO$_2$/KI/NCP/C) was formed. Leads were connected to ITO/TiO$_2$ and ITO/carbon substrates. The voltages and the currents produced by this cell for different intensities of light incident on it through the ITO/TiO$_2$ substrate, were recorded using appropriate measurement devices (Keithley 617 and Keithley 2400). About 0.75 volts and a maximum current of 0.1 mA were produced for a light intensity of about 4 mW/cm$^2$.

Example 10

On a glass substrate with indium tin-oxide (ITO) coating (substrate 1), a thin layer of titanium dioxide (consisting of TiO$_2$ nanoparticles) was deposited following a procedure known in the literature. Another ITO glass substrate (substrate 2) with a coating of carbon (C) deposited from a flame was prepared. Then a thin film of a nonconjugated conductive polymer (NCP), styrene-butadiene-rubber (SBR), was deposited from solution (in chloroform). The polymer film was doped with iodine. Then substrate 1 (with TiO$_2$) and substrate 2 were assembled as a sandwich with the doped polymer film between the two substrates. In a glass container, potassium iodide (KI) was dissolved in ethylene glycol. A few drops of that KI solution were introduced between the substrates (sandwich). Thus a photovoltaic cell (TiO$_2$/KI/NCP/C) was formed. Leads were connected to ITO/TiO$_2$ and ITO/carbon substrates. The voltages and the currents produced by this cell for different intensities of light incident on it through the ITO/TiO$_2$ substrate, were recorded using appropriate measurement devices (Keithley 617 and Keithley 2400). About 0.6 volts and a maximum current of 0.1 mA were produced for a light intensity of about 4 mW/cm$^2$.

Example 11

On a glass substrate with indium tin-oxide (ITO) coating (substrate 1), a thin layer of titanium dioxide (consisting of TiO$_2$ nanoparticles) was deposited following a procedure known in the literature. Another ITO glass substrate (substrate 2) with a coating of carbon (C) deposited from a flame was prepared. Then a thin film of a nonconjugated conductive polymer (NCP), styrene-butadiene-rubber (SBR), was deposited from solution (in chloroform). The polymer film was doped with iodine. Then substrate 1 (with TiO$_2$) and substrate 2 were assembled as a sandwich with the doped polymer film between the two substrates. Thus a photovoltaic cell (TiO$_2$/NCP/C) was formed. Leads were connected to ITO/TiO$_2$ and ITO/carbon substrates. The voltages and the currents produced by this cell for different intensities of light incident on it through the ITO/TiO$_2$ substrate, were recorded using appropriate measurement devices (Keithley 617 and Keithley 2400). About 0.5 volts and a maximum current of 0.2 mA were produced for a light intensity of about 4 mW/cm$^2$.

Example 12

On a glass substrate with indium tin-oxide (ITO) coating (substrate 1), a thin layer of titanium dioxide (consisting of TiO$_2$ nanoparticles) was deposited following a procedure known in the literature. Another ITO glass substrate (substrate 2) with a coating of carbon (C) deposited from a flame was prepared. Then a thin film of a nonconjugated conductive polymer (NCP), poly(β-pinene), was deposited from solution (in toluene). The polymer film was doped with iodine. Then substrate 1 (with TiO$_2$) and substrate 2 were assembled as a sandwich with the doped polymer film between the two substrates. Thus a photovoltaic cell (TiO$_2$/NCP/C) was formed. Leads were connected to ITO/TiO$_2$ and ITO/carbon substrates. The voltages and the currents produced by this cell for different intensities of light incident on it through the ITO/TiO$_2$ substrate, were recorded using appropriate measurement devices (Keithley 617 and Keithley 2400). About 0.6 volts and a maximum current of 0.3 mA were produced for a light intensity of about 4 mW/cm$^2$.

Example 13

On a glass substrate with indium tin-oxide (ITO) coating (substrate 1), a thin layer of titanium dioxide (consisting of TiO$_2$ nanoparticles) was deposited following a procedure known in the literature. Another ITO glass substrate (substrate 2) with a coating of carbon (C) deposited from a flame was prepared. Then a thin film of a nonconjugated conductive polymer (NCP), 1,4-cis-polyisoprene, was deposited from solution (in toluene). The polymer film was doped with iodine. Then substrate 1 (with TiO$_2$) and substrate 2 were assembled as a sandwich with the doped polymer film between the two substrates. Thus a photovoltaic cell (TiO$_2$/NCP/C) was formed. Leads were connected to ITO/TiO$_2$ and ITO/carbon substrates. The voltages and the currents produced by this cell for different intensities of light incident on it through the ITO/TiO$_2$ substrate, were recorded using appropriate measurement devices (Keithley 617 and Keithley 2400). About 0.5 volts and a maximum current of 0.2 mA were produced for a light intensity of about 4 mW/cm$^2$.

Example 14

On a glass substrate with indium tin-oxide (ITO) coating (substrate 1), a thin layer of titanium dioxide (consisting of TiO$_2$ nanoparticles) was deposited following a procedure known in the literature. Another ITO glass substrate (substrate 2) with a coating of carbon (C) deposited from a flame was prepared. Then a thin film of a nonconjugated conductive polymer (NCP), 1,4-trans-polyisoprene, was deposited from solution (in toluene). The polymer film was doped with iodine. Then substrate 1 (with TiO$_2$) and substrate 2 were assembled as a sandwich with the doped polymer film between the two substrates. Thus a photovoltaic cell (TiO$_2$/NCP/C) was formed. Leads were connected to ITO/TiO$_2$ and ITO/carbon substrates. The voltages and the currents produced by this cell for different intensities of light incident on it through the ITO/TiO$_2$ substrate, were recorded using appropriate measurement devices (Keithley 617 and Keithley 2400). About 0.6 volts and a maximum current of 0.25 mA were produced for a light intensity of about 4 mW/cm$^2$.

Therefore, having thus described the invention, at least the following is claimed:

1. A photovoltaic structure consisting essentially of an electrode of a transparent substrate coated with a high work function metal which has a cast film formed of a combination of a non-conjugated conductive polymer in non-conjugated form and an electron acceptor and a second electrode of low work function metal applied on the film,
    wherein the non-conjugated conductive polymer in non-conjugated form is selected from the group consisting of styrene-butadiene-rubber copolymer, cis-polyisoprene, polynobornene, polyalloocimene and poly(β-pinene).

2. The photovoltaic structure of claim 1, in which the high work function metal is indium-tin-oxide.

3. The photovoltaic structure of claim 1 in which the low work function metal is selected from the group consisting of aluminum, calcium, magnesium and titanium dioxide.

4. The photovoltaic structure of claim 1, in which the non-conjugated polymer is poly(β-pinene).

5. The photovoltaic structure of claim 1, in which the high work function metal is indium-tin-oxide and the low work function metal is selected from the group consisting of aluminum, calcium, magnesium and titanium dioxide.

6. The photovoltaic structure of claim 5 in which the low function metal is aluminum.

7. The photovoltaic structure of claim 1 in which the electron acceptor is fullerene in an amount of 2-15% by weight of the polymer.

8. The photovoltaic structure of claim 1 in which the second electrode of a low function metal is coated on a transparent substrate which is applied on the film.

9. A photovoltaic structure comprising a non-conjugated conductive polymer in non-conjugated form and an electron acceptor sandwiched between a high work function electrode and a low work function electrode, wherein the non-conjugated conductive polymer in non-conjugated form is selected from the group consisting of styrene-butadiene-rubber copolymer, cis-polyisoprene, polynobornene, polyalloocimene and poly(β-pinene).

10. The photovoltaic structure of claim 9 in which the electron acceptor is selected from the group of fullerene, a functionalized fullerene, carbon, iodine and potassium iodide.

11. A method of preparing a photovoltaic structure which comprises coating a transparent substrate with a high work function metal, casting a thin film of a combination of a non-conjugated conductive polymer in non-conjugated form and an electron acceptor and then applying a second electrode of low work function metal on the film,
    wherein the non-conjugated conductive polymer in non-conjugated form is selected from the group consisting of styrene-butadiene-rubber copolymer, cis-polyisoprene, polynobornene, polyalloocimene and poly(β-pinene).

12. The method of claim 11 in which the high work function metal is indium-tin-oxide.

13. The method of claim 11 in which the low work function metal is selected from the group consisting of aluminum, calcium, magnesium and titanium dioxide.

14. The method of claim 11 in which the non-conjugated polymer is poly(β-pinene).

15. The method of claim 11 in which the electron acceptor is fullerene.

16. The method of claim 11 in which a low function metal is coated on a glass substrate which is applied on the film.

17. A method of preparing a photovoltaic structure which comprises coating a glass substrate with indium-tin-oxide, forming a film of a combination of an electron acceptor selected from the group of fullerene, functionalized fullerene, carbon, iodine and potassium iodide and a non-conjugated conductive polymer in non-conjugated form selected from the group consisting of a styrene-butadiene-rubber copolymer, cis-polyisoprene, polynobornene, polyalloocimene and poly(β-pinene) and casting the film onto the glass substrate, and coating a low work function metal on a second glass substrate and then applying the second glass substrate to the film.

18. A photovoltaic array comprising at least two photovoltaic structures each of which comprises an electrode of a transparent substrate coated with a high work function metal which has a film of a combination of a non-conjugated conductive polymer in non-conjugated form and an electron acceptor selected from the group of fullerene, functionalized fullerene, carbon, iodine and potassium iodide and a second electrode of a low work function metal applied on the film,
wherein the non-conjugated conductive polymer in non-conjugated form is selected from the group consisting of styrene-butadiene-rubber copolymer, cis-polyisoprene, polynobornene, polyalloocimene and poly(β-pinene).

19. The photovoltaic array of claim 18 in which each photovoltaic structure has a high work function metal which is indium-tin-oxide.

20. The photovoltaic array of claim 18 in which each photovoltaic structure has a low work function metal selected from the group consisting of aluminum, calcium, magnesium and titanium dioxide.

21. The photovoltaic structure of claim 18, in which each photovoltaic structure has a high work function metal which is indium-tin-oxide and the low work function metal is selected from the group consisting of aluminum, calcium, magnesium and titanium dioxide.

* * * * *